United States Patent [19]

Inoue et al.

[11] 4,115,709

[45] Sep. 19, 1978

[54] GATE CONTROLLED DIODE PROTECTION FOR DRAIN OF IGFET

[75] Inventors: Yasukazu Inoue; Masanori Kikuchi, both of Tokyo, Japan

[73] Assignee: Nippon Electric Co., Ltd., Tokyo, Japan

[21] Appl. No.: 768,897

[22] Filed: Feb. 15, 1977

Related U.S. Application Data

[63] Continuation of Ser. No. 595,897, Jul. 14, 1975, abandoned.

[30] Foreign Application Priority Data

Jun. 13, 1975 [JP] Japan .................................. 50-71767
Jul. 16, 1974 [JP] Japan .................................. 49-81471

[51] Int. Cl.² ...................... H01L 27/04; H01L 29/78; H01L 29/90
[52] U.S. Cl. ................................ 307/304; 307/200 B; 357/13; 357/23; 357/41

[58] Field of Search ............................. 357/13, 23, 41; 307/213, 237, 304, 200 B

[56] References Cited

U.S. PATENT DOCUMENTS

| | | | |
|---|---|---|---|
| 3,395,290 | 7/1968 | Farina et al. ............................. | 357/23 |
| 3,470,390 | 9/1969 | Lin .......................................... | 357/23 |
| 3,673,427 | 6/1972 | McCoy et al. ........................... | 357/23 |
| 3,746,946 | 7/1973 | Clark ....................................... | 357/23 |
| 3,777,216 | 12/1973 | Armstrong ............................. | 357/23 |

*Primary Examiner*—William D. Larkins
*Attorney, Agent, or Firm*—Hopgood, Calimafde, Kalil, Blaustein & Lieberman

[57] ABSTRACT

An integrated circuit includes an insulated-gate field effect transistor and a protection device coupled to either the source or drain of the transistor. The protection device includes a gate-controlled diode having a breakdown voltage that is less than the breakdown voltage of the drain of the field effect transistor.

17 Claims, 8 Drawing Figures

GATE CONTROLLED DIODE PROTECTION FOR DRAIN OF IGFET

This is a continuation of Ser. No. 595,897 filed July 14, 1975, now abandoned.

This invention relates generally to semiconductor integrated circuits comprising insulated-gate field effect transistors, and more particularly to the protection of an insulated-gate field effect transistor in a circuit of this kind.

When an electric field applied to a drain of an insulated-gate field effect transistor exceeds a surface breakdown voltage of a p-n junction between the drain region and the substrate of the transistor, insulation breakdown occurs between the drain and the gate and the transistor is destroyed. This phenomenon is particularly noticeable when the gate potential is grounded, or when the transistor is in the "off" state, and as the gate film becomes thinner and the channel length becomes shorter. This phenomenon is present both in n-channel and p-channel insulated-gate field effect transistors, but is more prominent in n-channel devices.

Recently developed insulated-gate field effect integrated circuits which are characterized by higher speed and larger capacity, typically employ a thinner gate film and a shorter channel length of the insulated-gate field effect transistors, both of which increase the likelihood of destruction of the transistors due to the drain voltage. Moreover, in an insulated-gate field effect integrated circuit, an output terminal is connected to the drain or the source of an output transistor and one of the bonding pads for external lead out on the integrated circuit chip serves as the output terminal. Therefore, the output transistor in the "off" state becomes vulnerable to destruction due to the drain or source voltage and, in fact, is often destroyed by electric charges accumulated on the output terminal during the manufacturing process or the treatment after manufacture or by a surge voltage applied to the output terminal during the real or testing operation. Such destruction occurs not only in output transistors but also in other transistors such as transistors of an address latch circuit. This makes the treatment of the device difficult and reduces the production yield and reliability of the device.

It is therefore an object of the invention to provide a protection device for preventing the drain-gate insulation breakdown or destruction of an insulated-gate field effect transistor due to the electric field applied to the drain or source of the transistor.

The invention is featured by the use of a gate-controlled diode having a lower junction breakdown voltage than the breakdown voltage of the drain junction of the transistor to be protected. The gate-controlled diode is connected to the drain or source of the transistor to be protected. Where the transistor to be protected is an output transistor of the circuit, the gate-controlled diode is preferably connected to a point between the output electrode (drain or source) of the transistor and the bonding pad as the output terminal.

As is known, a gate-controlled diode has a structure like an insulated-gate field effect transistor except that it has no source region of the transistor. In other words, a gate-controlled diode has two adjacent semiconductor regions of opposite conductivity types to each other with a p-n junction therebetween. Two ohmic-contact electrodes are respectively connected to these two regions. A gate insulator covers from a part of the surface of the one region, beyond the p-n junction, to a part of the surface of the other region. A gate electrode is provided over the gate insulator.

In the present invention, the two ohmic-contact electrodes of the gate-controlled diode are electrically connected to the drain and the substrate of the transistor to be protected, respectively, so that the p-n junction of the gate-controlled diode is electrically connected in parallel with the drain junction of the transistor in the same polarity. The breakdown voltage of the p-n junction of the gate-controlled diode can be made lower than that of the drain junction of the transistor by controlling at least one factor of impurity concentration of either or both of the two regions, thickness of the gate insulator, and polarity and amplitude of a voltage applied to the gate electrode of the diode. The p-n junction of the diode may be formed conveniently in the substrate in which the drain and source junctions of the transistor are formed or all of these junctions may be simultaneously formed in the same substrate. Moreover, both the gate insulators of the transistor and the gate-controlled diode may be formed simultaneously.

Now, the invention will be explained more in detail with reference to the drawings in which.

The process of destruction of an insulated-gate field effect transistor due to the drain voltage differs from that due to that caused by the gate voltage in which a gate insulator is destroyed by the application of a very high gate voltage. When a voltage higher than the breakdown voltage of the drain junction is applied to the drain, avalanche breakdown of the drain junction occurs and hot carriers are generated thereby and injected into the gate insulator. When the avalanche breakdown continues to occur by the drain voltage after the punishing phenomenon, a large current amplifying mechanism starts to operate due to the bipolar transistor action of a parasitic transistor formed of a drain ($N^+$)- substrate (P)- source ($N^+$) structure (in the case of an N-channel field effect transistor) and a large amount of hot carriers are injected into the gate insulator. Since the quantity of injected charges in the gate insulator does not saturate, the gate insulator is thermally destroyed. In order to prevent such destruction of the gate insulator, it is necessary to (1) prevent the breakdown of the drain junction, or to (2) take the source away to prevent the formation of the parasitic bipolar transistor. According to the invention, the item (1) is attained for the transistor to be protected, by employing a protection device in which the item (2) is attained.

The semiconductor integrated circuit of the invention employs a gate-controlled diode as the protection device, the *p-n* junction breakdown voltage of which is made lower than the drain junction breakdown voltage. Thus, the junction breakdown solely occurs at the gate-controlled diode when a large voltage is applied to the drain, no fatal breakdown occurs at the drain junction and hence the destruction of the transistor can be prevented. In addition, injection of a large amount of hot carriers does not occur in the gate insulator of the diode and hence the diode is not destroyed.

The breakdown voltage of a *p-n* junction primarily depends upon the impurity concentrations of the regions on both sides of the junction. Where the insulating film on the exposed edge of the junction is thin, it also depends on the thickness of the insulating film. Moreover, the breakdown voltage further depends on the gate voltage applied to the gate electrode on the thin gate-insulating film in the gate-controlled diode. Therefore, the breakdown voltage of the gate-controlled diode is made lower than the drain breakdown voltage by controlling at least one of the impurity concentrations, the thickness of the gate insulator, and the gate voltage.

Figure 1:
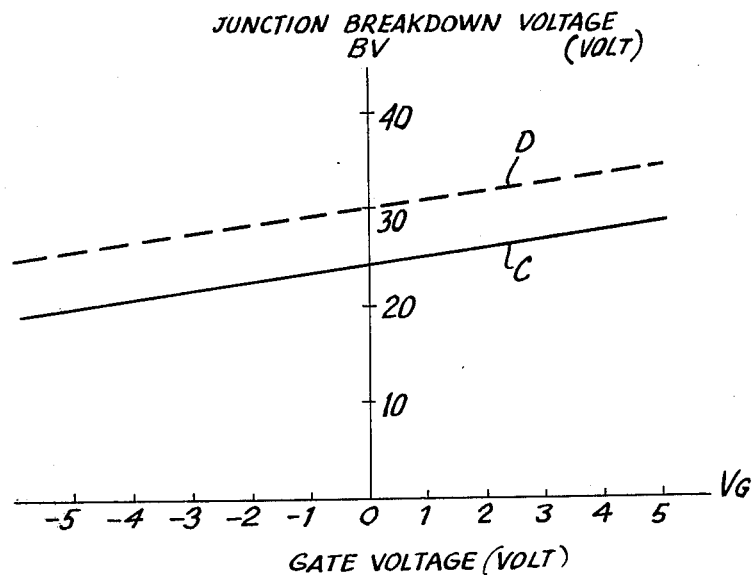
FIG. 1 is a graph showing junction breakdown voltage as a function of a gate voltage both before and after the pushing phenomenon.
Figure 2:
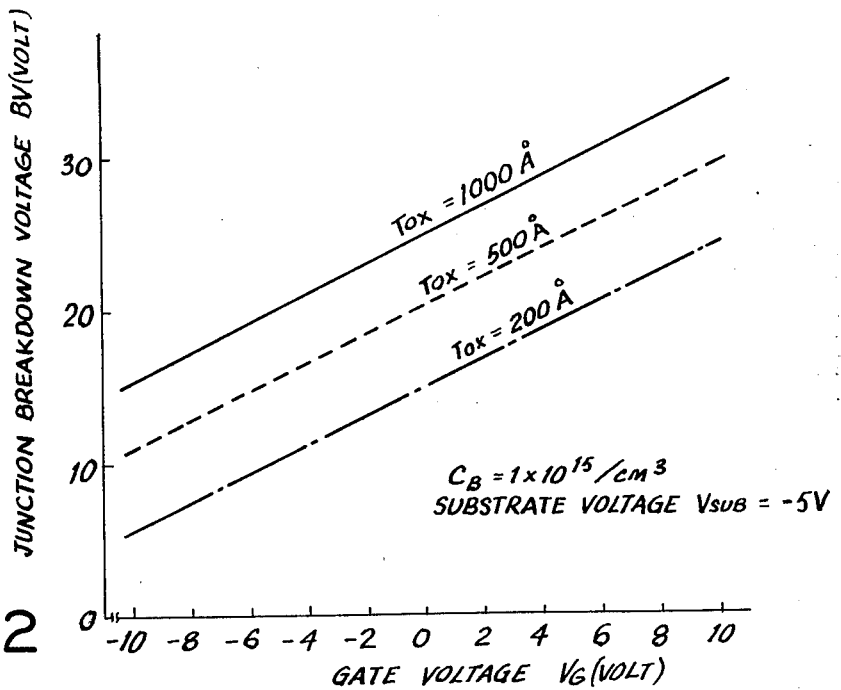
FIG. 2 is graph showing a junction breakdown voltage of gate-controlled diodes having gate insulators of different thicknesses as a function of gate voltage.
Figure 3:
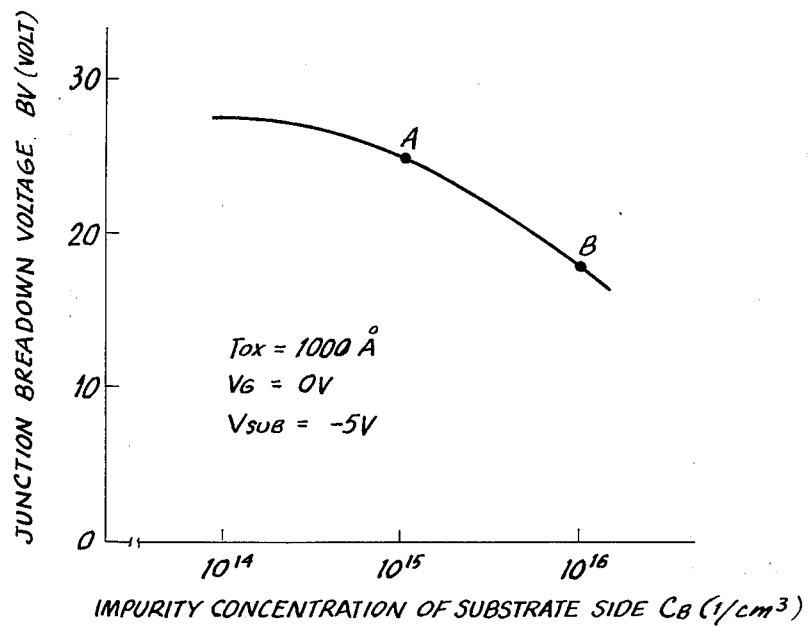
FIG. 3 shows relationship between junction breakdown voltage and impurity concentration of a substrate.

FIGS. 1 to 3 illustrate the breakdown voltage of *p-n* junctions of a gate-controlled diode and an N-channel field effect transistor simultaneously formed by introducing N-type regions into the same P-type silicon substrate. As shown in FIG. 2, which is the case of the impurity concentration (CB) and a voltage (Vsub) of an substrate being $1 \times 10^{15}$ cm$^{-3}$ and $-5$ volts, respectively, the junction breakdown voltage (BV) becomes lower as the thickness (Tox) of the SiO$_2$ gate insulator film becomes thinner. Thus, if the gate insulator of the transistor is 1000A thick, BV of the gate-controlled diode can be made lower than the BV of the drain by making the thickness of the gate insulator diode 500A. As shown in FIGS. 1 and 2, the junction breakdown voltage the (BV) becomes smaller as the gate voltage applied to the gate electrode becomes lower, where the gate insulator thickness is the same. Thus, it is possible to always make the BV of the gate-controlled diode less than that of the drain by applying a negative voltage to the gate electrode of the diode, because zero or a positive voltage is applied to the gate electrode in the N-channel field effect transistor. In the P-channel transistor the BV decreases as Vg increases, and hence a positive voltage should be applied for the mentioned purpose to the gate of the diode. FIG. 3 indicates that the junction breakdown voltage decreases as the impurity concentration increases, even where the gate film thickness and the gate voltage are constant (1000A and 0 volt, respectively). Thus, if the drain region of the transistor is formed in a P-type silicon substrate of an impurity concentration of $1 \times 10^{15}$ cm$^{-3}$, the breakdown voltage of the drain junction of this transistor is about 25 volts as indicated by a point A where the transistor is in the "off" state and by forming the N-type region of the gate-controlled diode in a P$^+$-type region of an impurity concentration of $1 \times 10^{16}$ cm$^{-3}$ formed in the same substrate, it is possible to make the breakdown voltage of the diode about 18 volts as indicated by the point B which is less than the drain breakdown voltage by 7 volts. Since a highly doped region, or so-called "channel stopper" region, having the same conductivity type as, but a higher impurity concentration than, the substrate is often formed at the surface of the substrate, except for the active regions where the transistors are positioned for the purpose of preventing the generation of a surface inversion layer, it is readily possible to reduce the junction breakdown voltage of the gate-controlled diode without any additional manufacturing process by forming the *p-n* junction of the diode in this highly doped "channel stopper" region. Since the breakdown of the drain junction and the junction of the gate-controlled diode is of the same mechanism of the surface breakdown of a P-N junction controlled by an insulated-gate electrode, there is no difference in the time constant of the breakdown. Therefore, a high voltage at the drain can be effectively cut off by the gate-controlled diode.

Where the gate insulator is very thin, the junction breakdown voltage is once increased by the injection of holes into the gate insulator after the avalanche breakdown of the junction. This phenomenon is known as the "pushing" or "walk out" phenomenon. The destruction of the gate insulator occurs at the time when this pushing phenomenon is completed. Therefore, the prevention of gate insulator destruction can be attained by preventing the final breakdown of the drain junction after the pushing phenomenon, or by controlling the final breakdown voltage of the junction of the gate-controlled diode after the pushing phenomenon to be lower than the final breakdown voltage of the drain junction. If the initial breakdown voltage before the pushing phenomenon of the diode junction is lower than that of the drain junction, its final breakdown voltage after the pushing phenomenon is also lower than that of the drain junction. If the initial breakdown voltage before the pushing phenomenon of the diode junction is lower than than of the drain junction, its final breakdown voltage after the pushing phenomenon is also lower than that of the drain junction. FIG. 1 shows that the final breakdown voltage indicated by a line D is higher than the initial breakdown voltage indicated by a line C but is still dependent on the gate voltage.

Figure 4:
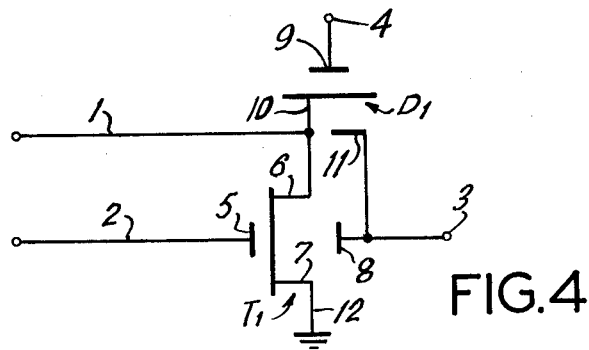
FIG. 4 is a circuit diagram showing a semiconductor integrated circuit according to one embodiment of the invention.
Figure 5A:
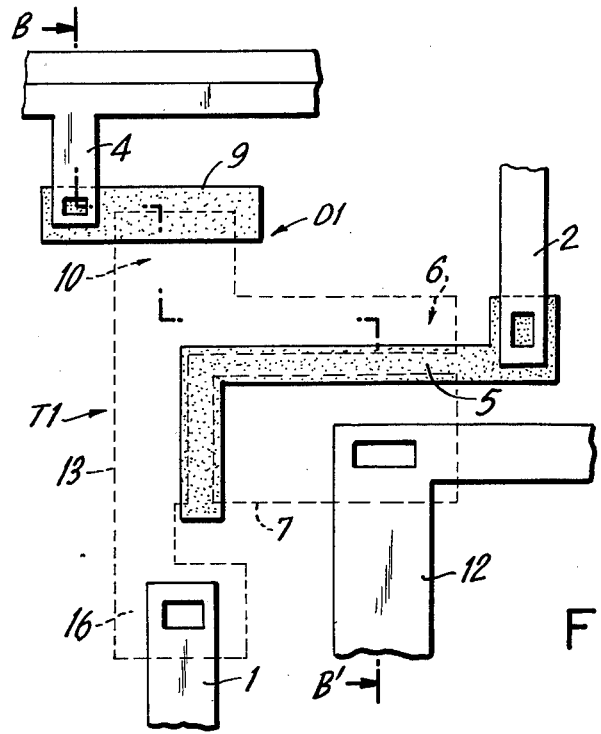
FIG. 5 illustrates a semiconductor integrated circuit structure that may be used to realize the circuit of FIG. 4, FIG. 5(A) being a plan view thereof and FIG. 5(B) being a cross-sectional view thereof taken along the line B-B' of FIG. 5(A) as viewed and looked in the direction of the arrows.
Figure 5B:
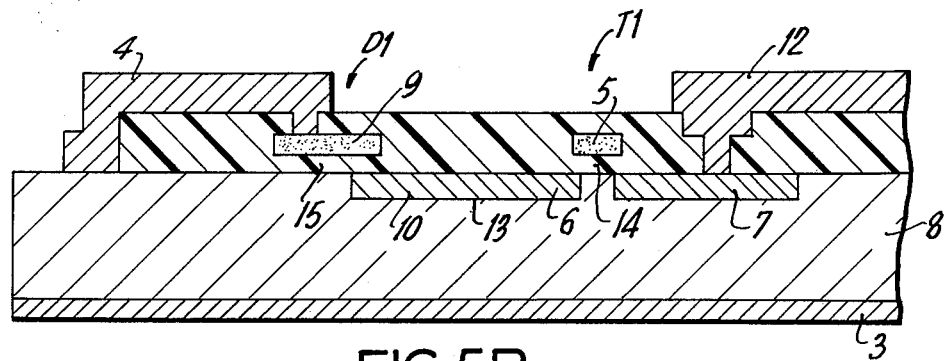

FIGS. 4 and 5 illustrate a semiconductor integrated circuit according to a first embodiment of the invention. As shown in FIG. 4, this circuit includes an insulated-gate field effect transistor T1 having a gate 5, a drain 6, a source 7, and a substrate 8 and a protective gate-controlled diode D1 having a gate 4, a region 10 of one conductivity type, and a substrate 11 of the opposite conductivity type. The gate 5 of the transistor T1 is connected to a signal line 2 and its source 7 is grounded. The drain 6 of transistor T1 is connected to an output or an external terminal 1 and the substrate 8 is connected to a substrate terminal 3. The region 10 and the opposite conductivity type substrate 11 of the diode D1 are connected to the drain 6 to the substrate 8 of the transistor T1, respectively, whereas the gate 9 of the diode is connected to a gate voltage source 4 which is of a negative polarity when the transistor T1 is of the N-channel type and of a positive polarity when transistor T1 is of the P-channel type. The circuit of FIG. 4 can be fabricated on the one and same semiconductor substrate 8 as exemplified in FIGS. 5(A) and 5(B). In the P-type silicon substrate 8, two N-type regions 7 and 13 are formed to the same depth. One of the N-type regions 7 is the source of the transistor T1 and a part 6 of the other region 13 adjoining the source region 7 with a narrow gap is the drain of the transistor T1. On this narrow gap, a thin SiO₂ gate insulator 14 and a polysilicon gate electrode 5 of the transistor T1 are stacked. An aluminum layer 12 of the ground line is in contact with a part of the source region 7 and an aluminum signal line 2 is connected to the gate electrode 5. One elongated end 16 of the N-type region 13 is connected to an output or external line 1 of aluminum layer, whereas another elongated end of the N-type region 13 constitutes the one conductivity type region 10 of the diode D1. On the edge of region 10 and the adjacent substrate region, which constitutes the opposite conductivity type substrate 11 of the diode D1, a thin SiO₂ gate insulator 15 and a polysilicon gate electrode 9 of the diode D1 are stacked. An aluminum layer 4 is in contact with the gate electrode 9 and the substrate 8. The substrate electrode 3 is attached on the back face of the substrate 8.

If the potential of the gate signal line 2 is 0 volt, which places transistor T1 in the "off" state, and the potential of the substrate electrode 3 and hence of the gate voltage line 4 of diode D1 is fixed at −5 volts, the breakdown voltages of the drain junction between the n-type region 6 and the substrate 8 and of the junction of diode D1 between the N-type region 10 and the substrate 8 are about 25 volts and about 20 volts, respectively, as is apparent from the line C of FIG. 1. When a surge voltage is applied to the output or external terminal 1, the junction of diode D1 is first broken down and its breakdown voltage increases up to about 25 volts by the pushing phenomenon as is apparent from the line D of FIG. 1. Since there is no parasitic N⁺-P-N⁺ transistor structure near the region 10, no large current amplifying action occurs and the gate insulator 15 of the diode is not destroyed. Thus, the drain junction of transistor T1 is free from the breakdown and transistor T1 is protected.

Figure 6:
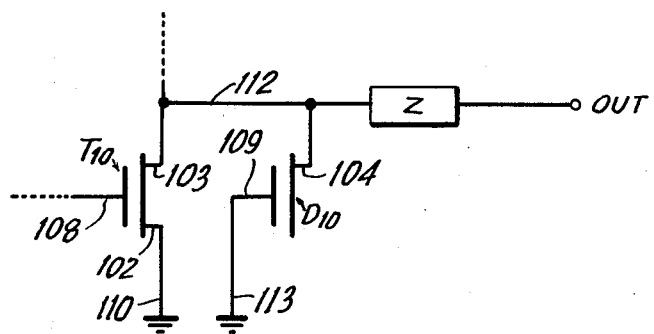
FIG. 6 is a circuit diagram of a semiconductor integrated circuit according to another embodiment of the invention.
Figure 7:
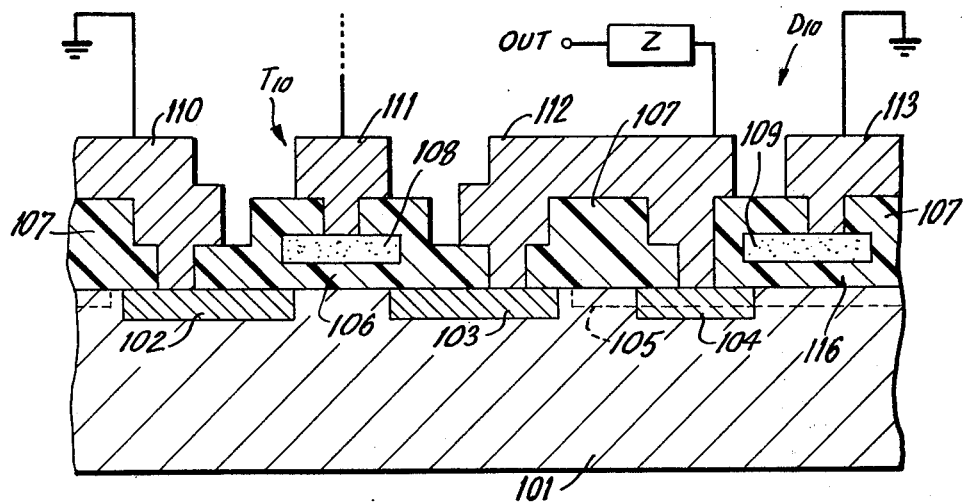
FIG. 7 is a cross-sectional view of a semiconductor integrated circuit structure that may be used to realize the circuit of FIG. 6.

In the embodiment of the invention shown in FIG. 6, a source 102 of an output insulated-gate field effect transistor T10 is grounded and its drain 103 is connected, through an impedance element Z which may be omitted, to an output terminal OUT. A gate 109 of a gate-controlled diode D10 is grounded and its one conductivity type region 104 and opposite conductivity type substrate are connected to the drain 103 and a substrate of the output transistor T10, respectively. The circuit of FIG. 6 may be realized, for example, by the integrated circuit of FIG. 7. As therein shown, by selectively diffusing phosphorus into the surface of a P-type silicon substrate 101 of a specific resistivity about 10Ω-cm, N-type regions 102, 103, and 104 of a surface phosphorus concentration of about $10^{19}$ cm$^{-3}$ are formed which are respectively used as the source and drain of the transistor T10, and the N-type region of the diode D10. A P⁺-type region 105 of the surface impurity concentration of about $10^{16}$cm$^{-3}$ is formed by the selective diffusion of boron, so that a P-N junction is formed with the N-type region 104 of the diode D10. This P⁺-type region also serves as a channel stopper for preventing field inversion. Gate insulators 106 and 116 made of SiO₂ of the transistor T10 and the diode D10 are formed by the thermal oxidation of the silicon substrate 101 to a film thickness of about 100A, and a field SiO₂ film 107 is also formed by thermal oxidation to a thickness of about 1 micron. Poly-crystalline silicon layers 108 and 109 for the gate electrodes of the transistor T10 and the diode D10 are formed by the thermal decomposition of SiH₄. By the use of an evaporated aluminum layer, ground lines 110 and 113 each respectively in contact with the source 102 of the transistor and the gate 109 of the diode, a gate signal line 111 connected to the gate 108 of the transistor, and an output line 112 in contact with both the drain 103 of the transistor and the N-type region 104 of the diode are all formed. With this structure, when the potential of the substrate 101 is −5 volts and the gate 108 of the transistor is grounded, the breakdown voltages of the drain junction between the drain 103 and the substrate 101 and of the junction between the N-type region 104 of the diode and the P⁺ type region 105 are respectively 25 volts and 18 volts. The threshold voltage at which an N-type inversion layer is generated under the field oxide 107 is 35 volts, and the bulk breakdown voltages of the junction between the region 102 or 103 and the substrate 101 and of the junction between the regions 104 and 105 are respectively 60 volts and 30 volts. No destruction of the output transistor T10 was observed due to charges accumulated on the output terminal and a surge voltage applied to the output terminal during the test and real operation. By using the principle of the first embodiment of the invention it is possible to further reduce the breakdown voltage of the gate-controlled diode D10 by connecting the gate 109 of the diode not to ground but rather to a negative voltage source such as the substrate 101 of −5 volts.

The integrated circuit of the invention has been herein specifically described mainly in connection with an N-channel insulated-gate field effect transistor. The destruction of the gate insulator as mentioned above occurs more readily in an N-channel transistor due to the difference in the ease of injection holes and electrons into the gate insulator. The same effect principally occurs also in a P-channel transistor, and hence the invention is applicable as well to a P-channel insulated-gate field effect transistor. Moreover, the description of the invention has been directed to the gate destruction due to the drain voltage. However, where an output terminal is connected to the source, the same gate destruction occurs due to a large voltage applied to the source. In this case, the gate-controlled diode of the invention is connected not to the drain but to the source. Although the transistors of the specifically described embodiments are silicon-gate transistors, the circuit of the invention can be equally applied to aluminum-gate transistors and other insulated-gate field effect transistors.

Thus though the invention has been illustrated by reference to several specific embodiments, numerous changes and modifications thereof which clearly fall within the scope of the invention will be apparent to those skilled in the art.

We claim:
1. An integrated circuit comprising a semiconductor chip including a semiconductor substrate, an insulated-gate field effect transistor having a source, a drain and a gate p-n junctions being respectively formed between said substrate and each of said source and drain, a plurality of bonding pads for external leads formed on said semiconductor chip, one of said bonding pads serving as an external lead for said transistor, and a protection device for preventing the gate insulator of said transistor from being destroyed by an excess electric field applied to said drain, said integrated circuit including means for connecting said protection device to said drain of said transistor, said gate being supplied with an input signal for said transistor, said drain being coupled with said one of said bonding pads, said source being supplied with a fixed voltage with respect to said substrate, said protection device including a gate-controlled diode having a p-n junction formed in said substrate, the breakdown voltage of said p-n junction of said gate-controlled diode being less than that of the p-n junction between said substrate and the drain of said transistor, and said gate of said transistor being electrically isolated from said drain of said transistor.

2. The integrated circuit as claimed in claim 1, further comprising impedance means connected between said drain of said transistor and said one of said bonding pads.

3. An integrated circuit comprising a semiconductor chip including a semiconductor substrate, an insulated-gate field effect transistor having a source, a drain and a gate with a p-n junction being respectively formed between said substrate and each of said source and drain, a plurality of bonding pads for external leads formed on said semiconductor chip, one of said bonding pads serving as an external terminal for said transistor, and a protection device for said transistor coupled to one of said drain and source of said transistor, said gate being electrically connected to a signal line for said transistor, said one of said drain and source being electrically connected to said one of said bonding pads and electrically isolated from said gate of said transistor, the other of said drain and source being supplied with a fixed voltage with respect to said substrate, said protection device including a gate-controlled diode having a p-n junction electrically connected internally of said integrated circuit in parallel with and in the same direction as said p-n junction between the substrate and one of said drain and source of said transistor, the breakdown voltage of said p-n junction of said gate-controlled diode being lower than that of the p-n junction between the substrate and said one of said drain and source of said transistor, whereby said transistor is protected against an excess voltage appearing at said one of said bonding pads.

4. The integrated circuit claimed in claim 3, further comprising means for applying an electric potential to the gate of said gate-controlled diode to reduce the breakdown voltage of the p-n junction of said gate-controlled diode to a value less than that of the p-n junction between the drain and the substrate of said transistor.

5. The integrated circuit claimed in claim 3, in which the insulator between the gate and the drain of said transistor has a film thickness less than about 1000 angstroms.

6. The integrated circuit claimed in claim 3, in which the gate insulator of said gate-controlled diode is of substantially the same material and of substantially the same film thickness as the gate insulator of said transistor.

7. The integrated circuit claimed in claim 6, in which the gate of said gate-controlled diode is supplied with a voltage of an opposite polarity with respect to a voltage applied to the gate of said transistor.

8. The integrated circuit claimed in claim 6, in which the gate of said gate-controlled diode is connected to said substrate.

9. The integrated circuit claimed in claim 3, in which a region of the same conductivity type as, and a higher impurity concentration than, said substrate is formed in a part of said substrate in which said p-n junction of said gate-controlled diode is formed.

10. The integrated circuit claimed in claim 9, in which the gate of said gate-controlled diode is grounded.

11. An integrated circuit comprising a semiconductor substrate of one conductivity type, a source and a drain region of the opposite conductivity type of an insulated-gate field effect transistor formed separately at the surface of said substrate with first and second p-n junctions being respectively formed between said substrate and said source and drain regions, a first gate insulator of said transistor formed on the surface of said substrate between said source and said drain regions, a first gate electrode of said transistor formed on said first gate insulator, an opposite conductivity type region of a gate-controlled diode formed at the surface of said substrate with a third p-n junction, a second gate insulator of said diode formed continuously on the surface of said opposite conductivity type region adjacent to said third p-n junction of said diode and on the surface of said substrate adjacent to said third p-n junction of said diode, and a second gate electrode of said diode formed on said second gate insulator of said diode and supplied with a voltage of an opposite polarity with respect to the voltage applied to said first gate electrode, said substrate being further provided with bonding pads for external leads, one of said bonding pads being an external terminal of said transistor, said first gate electrode being electrically connected to a signal line, said drain region being electrically connected to said one of said bonding pads and electrically isolated from said first gate electrode, said source region being supplied with a fixed voltage with respect to said substrate, said opposite conductivity type region of said diode being electrically connected internally of said integrated circuit to said drain region of said transistor, and the breakdown voltage of said third p-n junction of said diode being lower than that of said second p-n junction between said substrate and said drain region of said transistor.

12. The integrated circuit claimed in claim 11, in which said gate insulator of said transistor has a thickness between 1000 angstroms and 300 angstroms.

13. The integrated circuit claimed in claim 12, in which said first and second gate insulators of said transistor and said diode are formed of substantially the same material and are of substantially the same thickness.

14. The integrated circuit claimed in claim 13, in which said opposite conductivity type region of said diode is joined with said drain region of said transistor in said substrate.

15. The integrated circuit claimed in claim 13, further comprising a region of said one conductivity type having a higher impurity concentration than said substrate and formed at the surface of said substrate in contact with said opposite conductivity type region of said diode.

16. An integrated circuit comprising a semiconductor chip including a semiconductor substrate, an insulated-gate field effect transistor having a source, a drain and a gate with a p-n junction being respectively formed between said substrate and each of said source and drain, a plurality of bonding pads for external leads formed on said semiconductor chip, one of said bonding pads serving as an external terminal for said semiconductor chip, and a protection device for said transistor coupled to one of said drain and source of said transistor, said gate being electrically connected to a signal line for said transistor, said one of said drain and source being electrically connected through an impedance element to said one of said bonding pads and electrically isolated from said gate of said transistors, the other of said drain and source being supplied with a fixed voltage with respect to said substrate, said protection device including a gate-controlled diode having a p-n junction electrically connected internally of said integrated circuit in parallel with and in the same direction as said p-n junction between said substrate and said one of said drain and source of said transistor, the breakdown voltage of said p-n junction of said gate-controlled diode being lower than that of said p-n junction between said substrate and said one of said drain and source of said transistor, whereby said transistor is protected against an excess voltage appearing at said one of said bonding pads.

17. An integrated circuit comprising a semiconductor substrate of one conductivity type, a source and a drain region of the opposite conductivity type of an insulated gate field effect transistor formed separately at the surface of said substrate with first and second p-n junctions being respectively formed between said substrate and said source and drain regions, a first gate insulator of said transistor formed on the surface of said substrate between said source and said drain regions, a first gate electrode of said transistor formed on said first gate insulator, an opposite conductivity type region of a gate-controlled diode formed at the surface of said substrate with a third p-n junction, a second gate insulator of said diode formed continuously on the surface of said opposite conductivity type region adjacent to said third p-n junction of said diode and on the surface of said substrate adjacent to said third p-n junction of said diode, and a second gate electrode of said diode formed on said second gate insulator of said diode and supplied with a voltage of an opposite polarity with respect to the voltage applied to said first gate electrode, said substrate being further provided with a plurality of bonding pads for external leads, one of said bonding pads being an external terminal of said transistor, said first gate electrode being electrically connected to a signal line, one of said source and drain regions being electrically connected to said one of said bonding pads and electrically isolated from said first gate electrode, the other of said source and drain regions being supplied with a fixed voltage with respect to said substrate, said opposite conductivity type region of said diode being electrically connected internally of said integrated circuit to said one of said source and drain regions of said transistor, the breakdown voltage of said third p-n junction of said diode being lower than that of said second p-n junction between said substrate and said one of said source and drain regions of said transistor.

* * * * *